United States Patent
Kuo et al.

(10) Patent No.: US 9,759,745 B2
(45) Date of Patent: Sep. 12, 2017

(54) PROBE CARD

(71) Applicant: TAIWAN SEMICONDUCTOR MANUFACTURING COMPANY LTD., Hsinchu (TW)

(72) Inventors: Yung-Hsin Kuo, Hsinchu County (TW); Yuan-Li Lin, Taichung (TW); Po-Yi Huang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 451 days.

(21) Appl. No.: 14/265,153

(22) Filed: Apr. 29, 2014

(65) Prior Publication Data
US 2015/0309074 A1   Oct. 29, 2015

(51) Int. Cl.
  *G01R 1/067*   (2006.01)
  *G01R 1/073*   (2006.01)
  *G01R 1/20*    (2006.01)

(52) U.S. Cl.
CPC ..... *G01R 1/07378* (2013.01); *G01R 1/07371* (2013.01); *G01R 1/20* (2013.01)

(58) Field of Classification Search
CPC  G01R 1/067; G01R 1/07378; G01R 1/07371; G01R 3/00; G01R 31/31905; H01L 2924/381
USPC .......................... 324/755.01, 754.07, 756.03
See application file for complete search history.

(56) References Cited

U.S. PATENT DOCUMENTS

| | | | | |
|---|---|---|---|---|
| 4,259,077 A | * | 3/1981 | Keweza | G09B 23/186 434/118 |
| 5,808,948 A | * | 9/1998 | Kim | G11C 29/24 365/200 |
| 5,969,533 A | * | 10/1999 | Takagi | G01R 1/07342 324/754.07 |
| 6,215,320 B1 | * | 4/2001 | Parrish | G01R 1/07378 324/756.03 |
| 6,727,714 B2 | † | 4/2004 | Deguchi | |
| 6,864,105 B2 | * | 3/2005 | Grube | G01R 1/07314 438/14 |
| 7,196,531 B2 | * | 3/2007 | Grube | G01R 1/07314 324/756.03 |
| 7,279,911 B2 | * | 10/2007 | Tunaboylu | G01R 1/07378 324/756.03 |

(Continued)

*Primary Examiner* — Giovanni Astacio-Oquendo
(74) *Attorney, Agent, or Firm* — Chun-Ming Shih

(57) ABSTRACT

In some embodiments, a probe card includes a PCB, a substrate, a pair of probes, a capacitive device and a first part. The PCB includes a pair of conductive paths through a first surface and a second surface of the PCB. The substrate includes a pair of conductive paths through a first surface and a second surface of the substrate. The conductive paths of the substrate and the corresponding conductive paths of the PCB are coupled between the first surface of the substrate and the second surface of the PCB. The probes and the corresponding conductive paths of the substrate are coupled beyond the second surface of the substrate. The capacitive device is coupled between a first conductive path and a second conductive path through the PCB, the substrate and the probes. The first part is configured beyond the second surface of the PCB, and holds the capacitive device.

20 Claims, 13 Drawing Sheets

(56) References Cited

U.S. PATENT DOCUMENTS

| | | | |
|---|---|---|---|
| 7,368,927 B2 * | 5/2008 | Smith | G01R 1/0735 |
| | | | 324/754.07 |
| 2005/0035775 A1 * | 2/2005 | Zhou | G01R 1/06716 |
| | | | 324/755.08 |
| 2010/0120267 A1 † | 5/2010 | Eldridge | |
| 2014/0176177 A1 * | 6/2014 | Ku | G01R 1/06772 |
| | | | 324/756.03 |

\* cited by examiner
† cited by third party

US 9,759,745 B2

PROBE CARD

BACKGROUND

In integrated circuit manufacturing, testing is typically performed at the wafer level and at the packaging level. When a device under test (DUT) is tested at the wafer level, the DUT is coupled to an automated test equipment (ATE) using a probe card. As an interface between the ATE and the DUT, one surface of the probe card is designed to be coupled to pogos of the ATE, and the opposite surface of the probe card is equipped with probes for contacting contact pads on the DUT. Electrical signals can then be transferred through conductive paths between the ATE and the DUT in the probe card to allow testing and validation of the DUT by the ATE.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
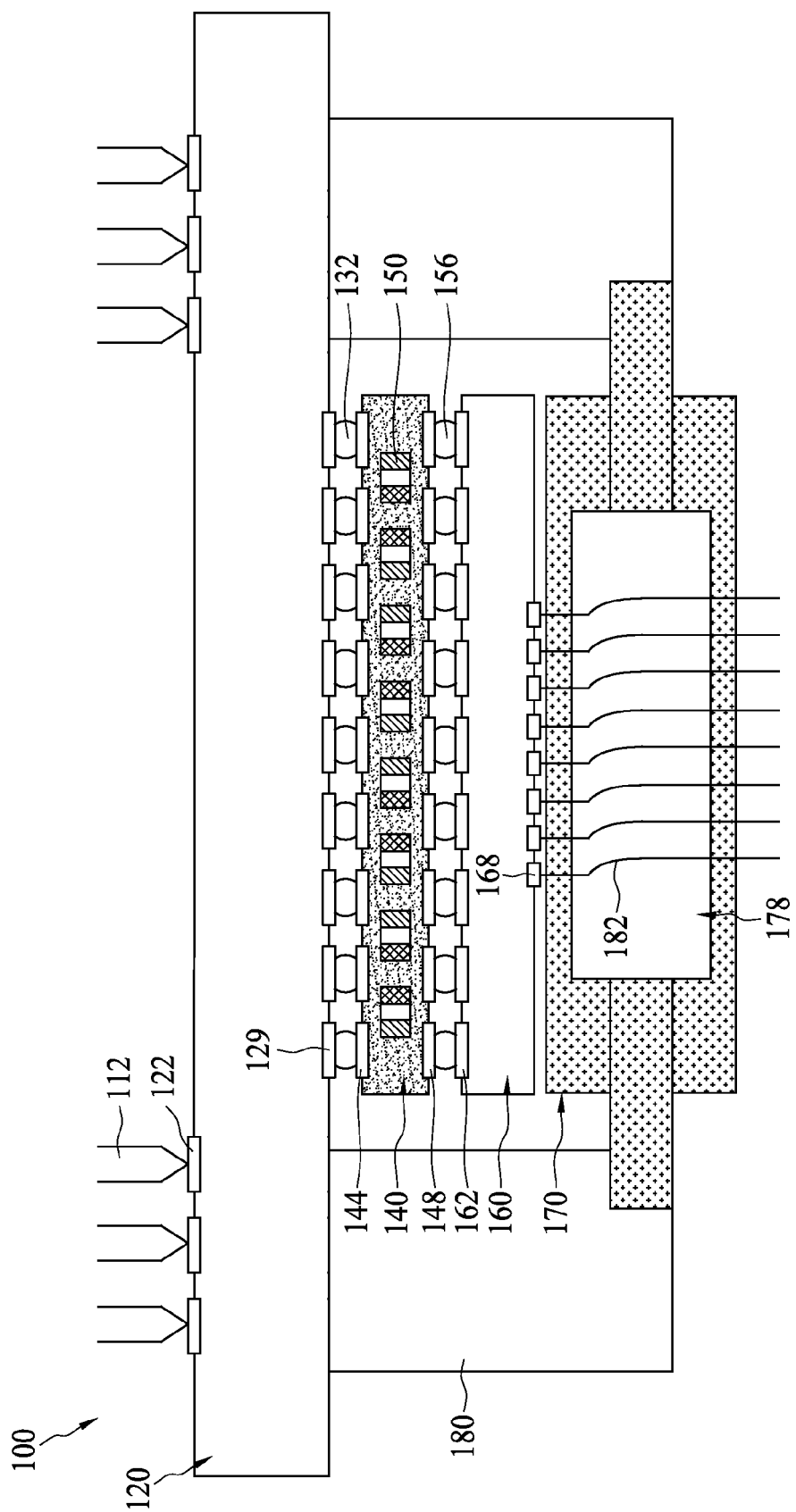
FIG. 1A is a schematic cross-sectional diagram of a probe card with capacitive devices embedded in an interposer layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "upward", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1A is a schematic cross-sectional diagram of a probe card 100 with capacitive devices 150 embedded in an interposer layer 140 in accordance with some embodiments. The probe card 100 is configured with capacitive devices 150, each of which is coupled between a conductive path in the probe card 100 coupled to a power pad or an input or output (IO) pad of the DUT (not shown), and a conductive path in the probe card 100 coupled to a ground pad of the DUT. Due to parasitic resistance and inductance of the conductive paths, noise can be introduced to a supply voltage or a signal seen by the DUT. Each of the capacitive devices 150 is used as the DUT's local energy storage to stabilize the supply voltage and/or to bypass the conductive path corresponding to the power pad or the IO pad to the conductive path corresponding to the ground pad so as to filter away the noise.

In some embodiments, the probe card 100 includes a PCB 120, solder bumps 132, the interposer layer 140, the capacitive devices 150, solder bumps 156, a substrate 160, a probe head 170, an array of probes 182 and a jig 180. In FIG. 1A, electrical connections between the components of the probe card 100 are shown, but electrical connections within the components of the probe card 100 are not shown. The PCB 120 includes pads 122 and 129 on an upper surface and a lower surface of the PCB 120, respectively. The term "on" used herein, such as "pads on an upper surface", refers to both fully beyond and resting upon the surface, and partially beyond and penetrating through the surface. The interposer layer 140 includes pads 144 and 148 on an upper surface and a lower surface of the interposer layer 140, respectively. The capacitive devices 150 are embedded in the interposer layer 140. The substrate 160 includes pads 162 and 168 on an upper surface and a lower surface of the substrate 160, respectively. The pads 122 on the upper surface of the PCB 120 are configured to be in contact with pogos 112 of an ATE (not shown). The pads on the lower surface of the PCB 120 are configured to be coupled to the pads 144 on the upper surface of the interposer 140 using the solder bumps 132. The pads 148 on the lower surface of the interposer layer 140 are configured to be coupled to the pads 162 on the upper surface of the substrate 160. The pads 168 on the lower surface of the substrate 160 are configured to be coupled to the probes 182. The probe head 170 is positioned under the lower surface of the substrate 160 by the jig 180 attached to the lower surface of the PCB. The probes 182 penetrate through the probe head 170. The probes 182 are configured to be in contact with pads on the DUT.

Figure 1B:
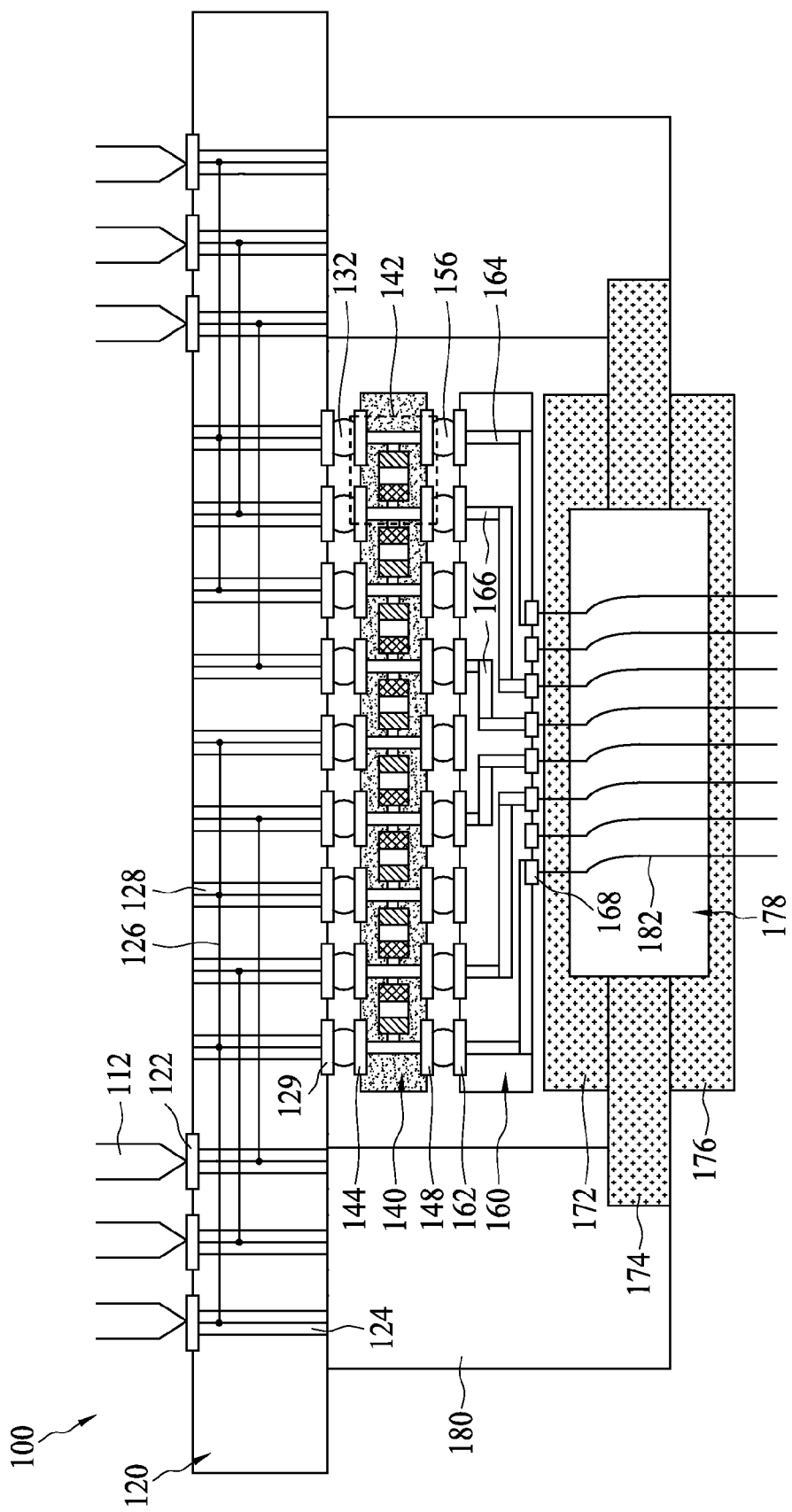
FIG. 1B is a schematic cross-sectional diagram of the probe card with the capacitive devices embedded in the interposer layer in accordance with some embodiments.

FIG. 1B is a schematic cross-sectional diagram of the probe card 100 with the capacitive devices 150 embedded in the interposer layer 140 in accordance with some embodiments. The conductive paths within the components of the probe card 100 are shown. Some of the components of the probe card 100 and the conductive paths of the probe card 100 are described in more detail with reference to FIG. 1B.

In some embodiments, the PCB 120 acts as an interface of the probe card 100 to the ATE. In some embodiments, in addition to the pads 122 and 129, the PCB 120 further includes multiple insulating layers (not shown), via holes 124, interconnect lines 126 and via holes 128. The pads 122 on the upper surface of the PCB 120 are to be in contact with the pogos 112. The pogos 112 are spring loaded pins for providing reliable electrical connections between the ATE and the probe card 100. The via holes 124 are coupled to the pads 122, penetrate through one or more of the multiple insulating layers, and are coupled to one ends of the corresponding interconnect lines 126 along different layers in the multiple insulating layers. The via holes 128 are coupled to the pads 129 on the lower surface of the PCB 120, penetrate through one or more of the multiple insulating layers and are coupled to the other ends of the corresponding interconnect lines 126. In some embodiments, the via holes 124 and 128 are implemented as through via holes that penetrate through the multiple insulating layers of the PCB 120, interstitial via holes (IVH) that penetrate through some of the multiple insulating layers of the PCB 120, or combinations thereof.

In some embodiments, a stiffener (not shown) is provided on an upper surface of the PCB 120 to improve stiffness of the probe card 100 and suppress variations in the co-planarity of the probes 182.

In some embodiments, the pads 129 on the lower surface of the PCB 120 are coupled to the pads 144 on the upper surface of the interposer layer 140 using the solder bumps 132. In some embodiments, the solder bumps 132 are formed of high-lead, eutectic, or lead-free solder. In other embodiments, as will be described with reference to FIG. 9, the pads 129 on the lower surface of the PCB 120 are coupled to the pads 144 on the upper surface of the interposer layer 140 using wire bundles 532 held within another interposer layer 530.

Figure 1C:
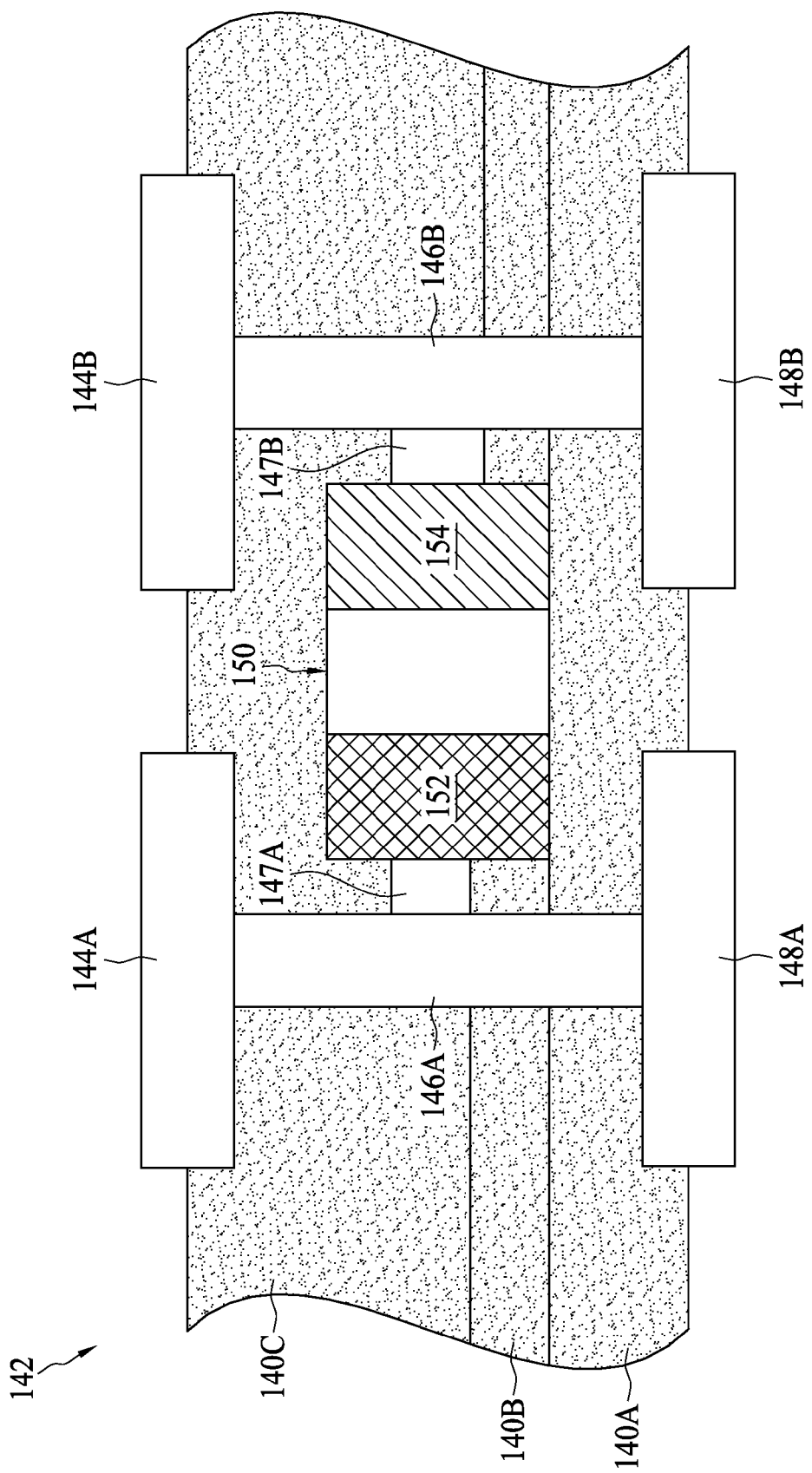
FIG. 1C is a schematic cross-sectional diagram of a zoomed-in portion in the interposer layer in FIG. 1B in accordance with some embodiments.

In some embodiments, the interposer layer 140 is interposed between the PCB 120 and the substrate 160 for the capacitive devices 150 (labeled in FIG. 1A) to be embedded therein. FIG. 1C is a schematic cross-sectional diagram of a zoomed-in portion 142 in the interposer layer 140 in FIG. 1B in accordance with some embodiments. The zoomed-in portion 142 shows an adjacent pair of conductive paths through the interposer layer 140 and the embedded capacitive device 150 configured therebetween. Each of other adjacent pairs of the conductive paths through the interposer layer 140 and the respective capacitive devices 150 therebetween are similar to the zoomed-in portion 142. In addition to the pads 144 and the pads 146, the interposer layer 140 further includes multiple insulating layers 140A, 140B and 140C, via holes 146, and interconnect lines 147. The adjacent pair of conductive paths are formed by a power pad 144A, a power via hole 146A and a power pad 148A, and a ground pad 144B, a ground via hole 146B and a ground pad 148B, respectively. The pads 148A and 148B are formed on a lower surface of the layer 140C. The via holes 146A and 146B penetrate through the layers 140A, 140B and 140C, and couple the pads 144A and 144B to the pads 148A and 148B, respectively. The capacitive device 150 is embedded in the interposer layer 140. In some embodiments, the capacitive device 150 is configured on an upper surface of the layer 140C, partially surrounded by the layer 140B and is covered by the layer 140A. In some embodiments, the capacitive device 150 is configured between the via holes 146A and the 146B. An anode 152 of the capacitive device 150 is to the via hole 146A through the interconnect line 147A, a cathode 154 of the capacitive device 150 to the via hole 146B through the interconnect line 147B.

Referring to FIG. 1B, in some embodiments, electrical connections between the pads 148 on the lower surface of the interposer layer 140 and the pads 162 on the upper surface of the substrate 160 are formed similarly as the electrical connections between the pads 129 on the lower surface of the PCB 120 and the pads 144 on the upper surface of the interposer layer 140

In some embodiments, the substrate 160 serves to transform a pitch of the pads 162 on the upper surface of the substrate 160 corresponding to a pitch of the pads 129 on the lower surface of the PCB 120, to a pitch of the pads 168 on the lower surface of the substrate 160 corresponding to a pitch of the pads on the DUT. Due the transformation of the pitches, interconnect lines 164 and 166 in the substrate 160 has a high wiring density. In some embodiments, the substrate 160 is a multi-layer organic (MLO) substrate or a multi-layer ceramic (MLC) substrate. The MLO substrate uses a resin as a base material. The MLC substrate uses ceramics as a base material. In some embodiments, controlled collapsed chip connection (C4) bumps are formed on the pads 168 for forming electrical connections between the pads 168 and the probes 182.

In some embodiments, the probes 182 are vertical probes such as cobra probes. A cobra probe is curved such that when the probe 182 is in contact with the pad of the DUT, the cobra probe deflects and thereby causes a spring force that enables a good electrical contact with the pad of the DUT. The probe head 170 encloses a space 178 for accommodating elastic deformation of the probes 182. The probe head 170 includes an upper die 172, a spacer 174 and a lower die 176. The spacer 174 separates the upper die 172 and the lower die 176 and has an aperture that extends above into the upper die 172 and below into the lower die 176 to form the space 178. The upper die 172 has an array of holes corresponding to the pads 168. The lower die 176 has an array of holes that are offset from the array of holes of the upper die 172 due to the curvatures of the probes 182. The array of holes in the upper die 172 are aligned to the pads 168 using the jig 180. The probe head 170 fits within the jig 180. The probes 182 connected to the pads 168 penetrate through the holes of the upper die 172, the space 178 and the holes of the lower die 176. In some embodiments, the upper die 172 and the lower die 174 are formed of an insulating material such as vespel or ceramic.

In the following, an example of the probes 182 driven by the pogos 112 via the conductive paths through the probe card 100 is described with reference to FIG. 1B. In FIG. 1B, there are eight probes 182. The center four probes 182 are to be in contact with power pads of the DUT, the outermost two probes 182 are to be in contact with ground pads of the DUT, and the two probes 182 between the center four probes 182 and the outermost two probes 182 are to be in contact with, for example, IO pads of the DUT. In addition, the inner four pogos 112 are coupled to power of the ATE, and the outer two pogos 112 are coupled to ground of the ATE. Conductive paths are formed between the inner four pogos 112 and the power pads of the DUT in contact with the center four probes 182, and between the outer two pogos 112 and the ground pads of the DUT in contact with the outermost two probes 182. Conductive paths for the IO pads are not shown in this cross-section.

In the PCB 120, the pads 122 in contact with the outer two pogos 112 are coupled to the first, third, fifth, seventh and ninth pads 129 (starting from the leftmost pad 129) through the corresponding via holes 124, interconnect lines 126 and via holes 128. The pads 122 in contact with the inner four pogos 112 are coupled to the second, fourth, sixth, and eighth pad 129, respectively. Therefore, the pads 129 have interleaving power pads and ground pads.

The pads 129 are coupled to the pads 144 having the same pitch as the pads 129 through the solder bumps 132. In the interposer layer 140, the pads 144 are coupled to the pads 148 having the same pitch as the pads 144 through via holes 146 (labeled in FIG. 1C). Therefore, the via holes 146 also have interleaving power via holes and ground via holes. Each of the capacitive device 150 (labeled in FIG. 1C) is located and coupled between the respective adjacent power via hole and ground via hole. Each of the power via holes, such as the second, fourth, sixth and eighth via holes 146 has two associated capacitive devices 150 configured on opposite sides of the power via hole.

The pads 148 are coupled to the pads 162 having the same pitch as the pads 148 through solder bumps 156. The solder bumps 156 corresponding to the third and seventh pads 162 are dummy solder bumps. In the substrate 160, the pads 162 are coupled to the pads 168 having a smaller pitch than the pads 162. The first and the ninth pads 162 are coupled to the outermost two pads 168 through the interconnect lines 164. The second, fourth, sixth and eighth pad 162 are coupled to the center four pads 168, respectively, through the interconnect lines 166. The center four pads 168 are coupled to the center four probes 182, and the outermost two pads 168 are coupled to the outermost two probes 182.

Figure 2:
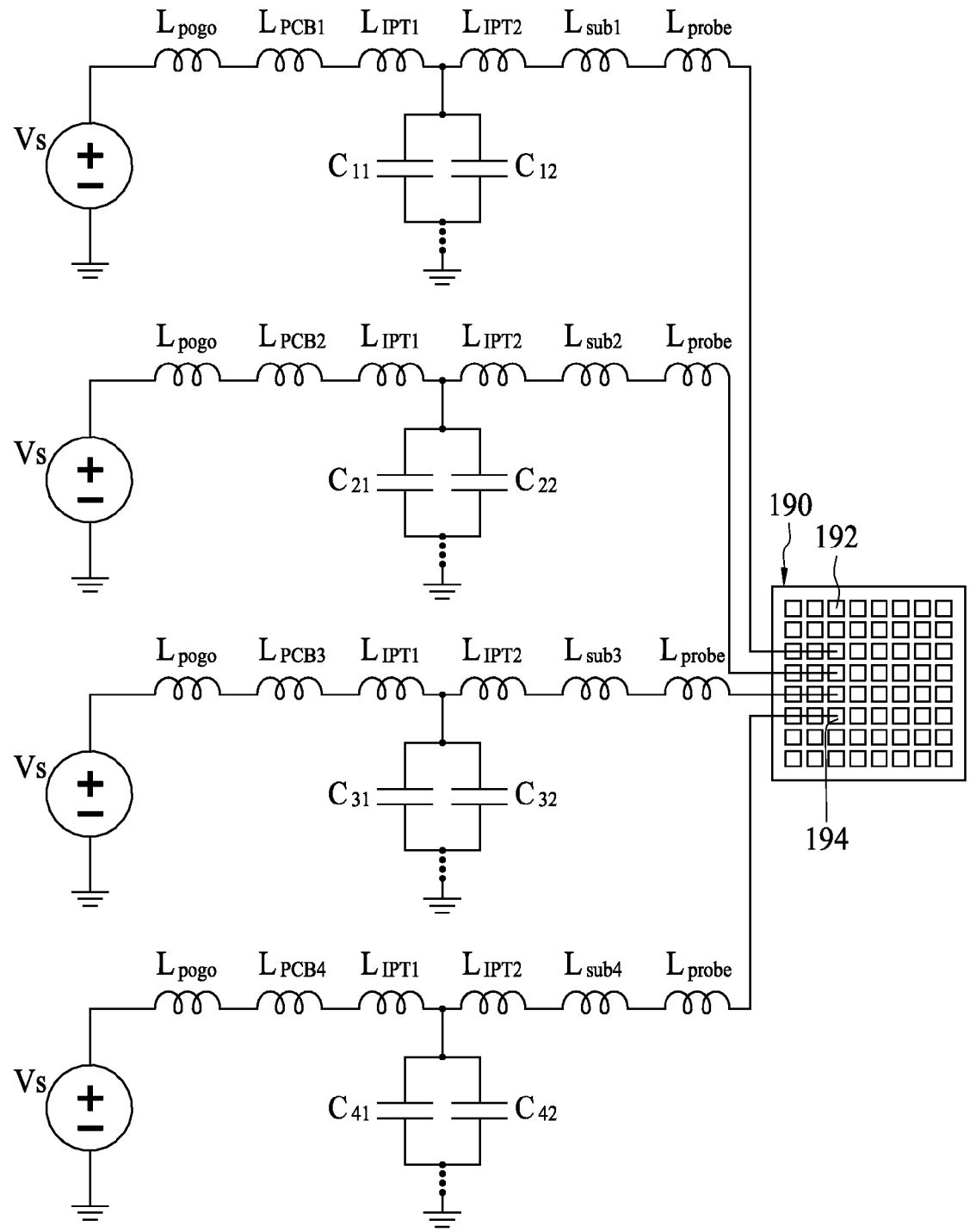
FIG. 2 is a schematic circuit diagram illustrating the conductive paths in the probe card in FIG. 1B in accordance with some embodiments.

FIG. 2 is a schematic circuit diagram illustrating the conductive paths in the probe card 100 in FIG. 1B in accordance with some embodiments. The conductive path in the probe card 100 have parasitic inductance that can induce a voltage drop when a transient current flows through the conductive path, such as during switching of a circuit in the DUT. The voltage drop causes the internal supply voltage of the circuit to deviate from the external supply voltage generated by the ATE and introduces a high frequency noise to the internal supply voltage.

In FIG. 2, a voltage source $V_s$ provides the external supply voltage to the pogo 112 (shown in FIG. 1B) represented by an inductor $L_{pogo}$. The pogo 112 is coupled to the conductive path in the PCB 120. The conductive path through the PCB 120 includes the pad 122, the via hole 124, the interconnect line 126, the via hole 128 and the pad 129 and is represented by an inductor $L_{PCB1}$, $L_{PCB2}$, $L_{PCB3}$ or $L_{PCB4}$.

The conductive path in the PCB 120 is coupled to the conductive path in the interposer layer 140. The conductive path between the PCB 120 and the interposer layer 140, and through the interposer layer 140 includes a first portion represented by an inductor $L_{ITP1}$ and a second portion represented by an inductor $L_{ITP2}$. The first portion includes the solder bump 132, the pad 144, a portion of the via hole 146 (labeled in FIG. 1C). The second portion includes the reset of the via hole 146 and the pad 148. The conductive path in the interposer layer 140 is coupled to the conductive path in the substrate 160.

The conductive path between the interposer layer 140 and the substrate 160, and through the substrate 160 is represented by an inductor $L_{sub1}$, $L_{sub2}$, $L_{sub3}$ or $L_{sub4}$. The conductive path between the interposer layer 140 and the substrate 160, and in the substrate 160 includes the solder bump 156, the pad 162, the interconnect line 166, and the pad 168. The conductive path through the substrate 160 is coupled to the probe 182. The probe 182 is represented by an inductor $L_{probe}$. The probe 182 is coupled to a power pad 194 of a DUT 190. For simplicity, only the conductive paths to the power pads 194 of the DUT 190 are shown, and the conductive paths to ground pads 192 of the DUT 190 are not shown.

In order to filter away the high frequency noise induced by the parasitic inductance in the conductive paths of the probe card 100, each of the power conductive paths in the probe head 100 in FIG. 1B has a bypass to the ground conductive path through two adjacent capacitive devices 150 coupled in parallel. In FIG. 2, the parallel bypass capacitors $C_{11}$ and $C_{12}$, $C_{21}$ and $C_{22}$, $C_{31}$ and $C_{32}$, or $C_{41}$ and $C_{42}$ are located between the inductors $L_{ITP1}$ and $L_{ITP2}$. Therefore, the inductors seen by the power pad 194 of the DUT 190 are the inductors $L_{ITP2}$, $L_{sub1}$ and $L_{probe}$, $L_{ITP2}$, $L_{sub2}$ and $L_{probe}$, $L_{ITP2}$, $L_{sub3}$ and $L_{probe}$, or $L_{ITP2}$, $L_{sub4}$ and $L_{probe}$.

Figure 3:
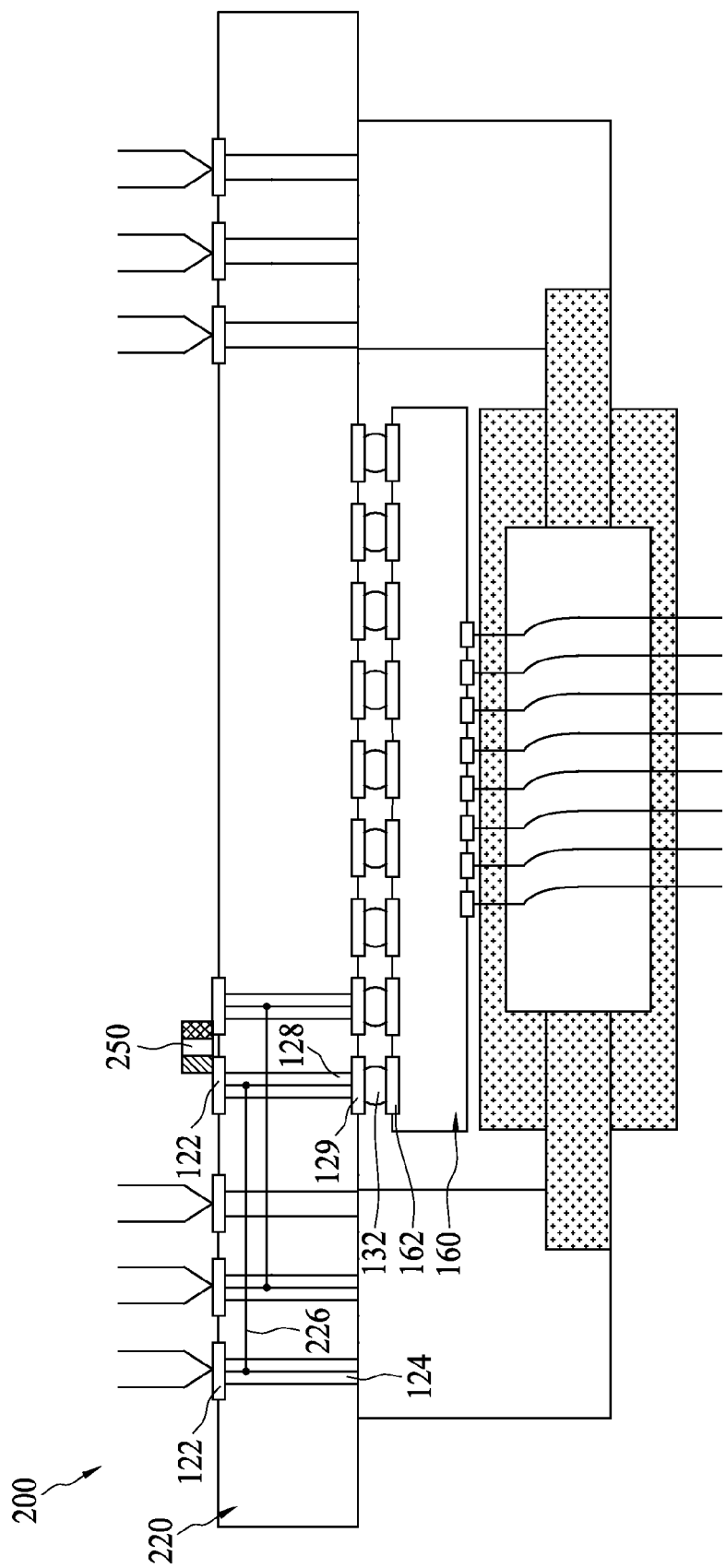
FIG. 3 is a schematic cross-sectional diagram of a probe card with a capacitive device configured on an upper surface of the PCB for comparison purpose.

FIG. 3 is a schematic cross-sectional diagram of a probe card 200 with a capacitive device 250 configured on an upper surface of the PCB 220 for comparison purpose. Compared to the probe card 100 in FIG. 1B, the probe card 200 does not have the interposer layer 140. The pads 129 of the PCB 220 are directly coupled to the pads 162 of the substrate 160 using the solder bumps 132. In addition, the capacitive device 250 is placed on the upper surface of the PCB 220. The capacitive device 250 is coupled to conductive paths in the PCB 220 through the corresponding pads 122 and via holes 128. Because the associated circuitry of the capacitive device 250 is formed within the PCB 220, when either the conductive paths in the PCB 250 or the circuitry of the capacitive device 250 are not functioning properly, the PCB 220 has to be replaced, as opposed to the interposer layer 140 in FIG. 1B that can be replaced independent of the PCB 120.

Figure 4:
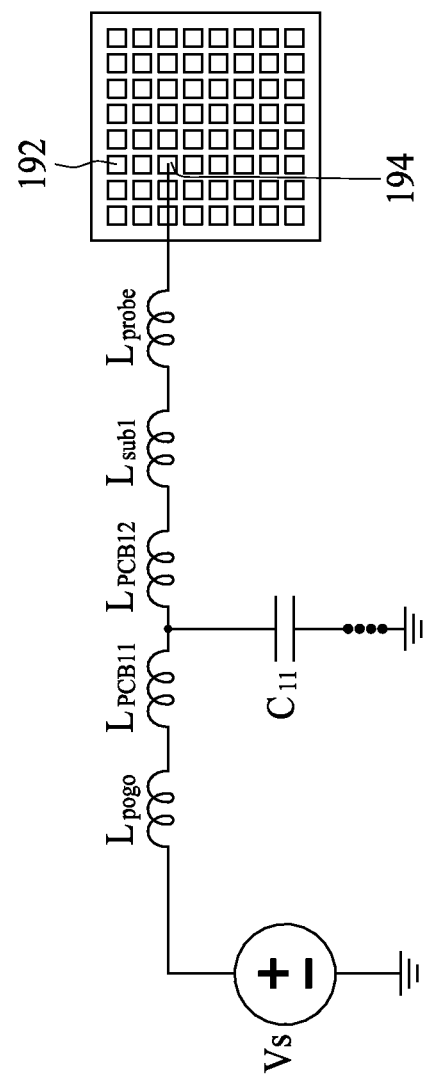
FIG. 4 is a schematic circuit diagram illustrating conductive paths in the probe card in FIG. 3 for comparison purpose.

FIG. 4 is a schematic circuit diagram illustrating conductive paths in the probe card 200 in FIG. 3 for comparison purpose. Compared to one of the power conductive paths in FIG. 2, the power conductive path in the PCB 250 includes a first portion represented by an inductor $L_{PCB11}$, and a second portion represented by an inductor $L_{PCB12}$. The first portion includes the pad 122, the via hole 124, and an interconnect line 226. The second portion includes the via hole 128 and the pad 129. The inductor $L_{PCB12}$ is directly coupled to the inductor $L_{sub1}$ of the substrate 160. The capacitive device 250 is coupled between the first portion and the second portion of the power conductive path in the PCB 220. Therefore, a bypass capacitor $C_{11}$ representing the capacitive device 250 is coupled between the inductors $L_{pCB1}$ and $L_{PCB2}$. The inductors seen by the power pad 194 of the DUT 190 are the inductors $L_{PCB12}$, $L_{sub1}$ and $L_{probe}$. The inductance seen by the power pad 194 in FIG. 4 and the inductance see by the power pad 194 in FIG. 2 differ by the inductor $L_{PCB12}$ in FIG. 4 and the inductor $L_{ITP2}$ in FIG. 2. The inductor $L_{PCB12}$ represents the inductance of the via hole 128 and the pad 129 in FIG. 3. The inductor $L_{ITP2}$ represents the inductance of a portion, approximately half, of the via hole 146 and the pad 148 in FIG. 1B. Since the PCB 250 is thicker than the interposer layer 140, the inductance of the whole via hole 128 is larger than the inductance of the portion of the via hole 146. The larger the inductance is seen by the power pad 194, the higher the power pad 194 is susceptible to noise.

Figure 5:
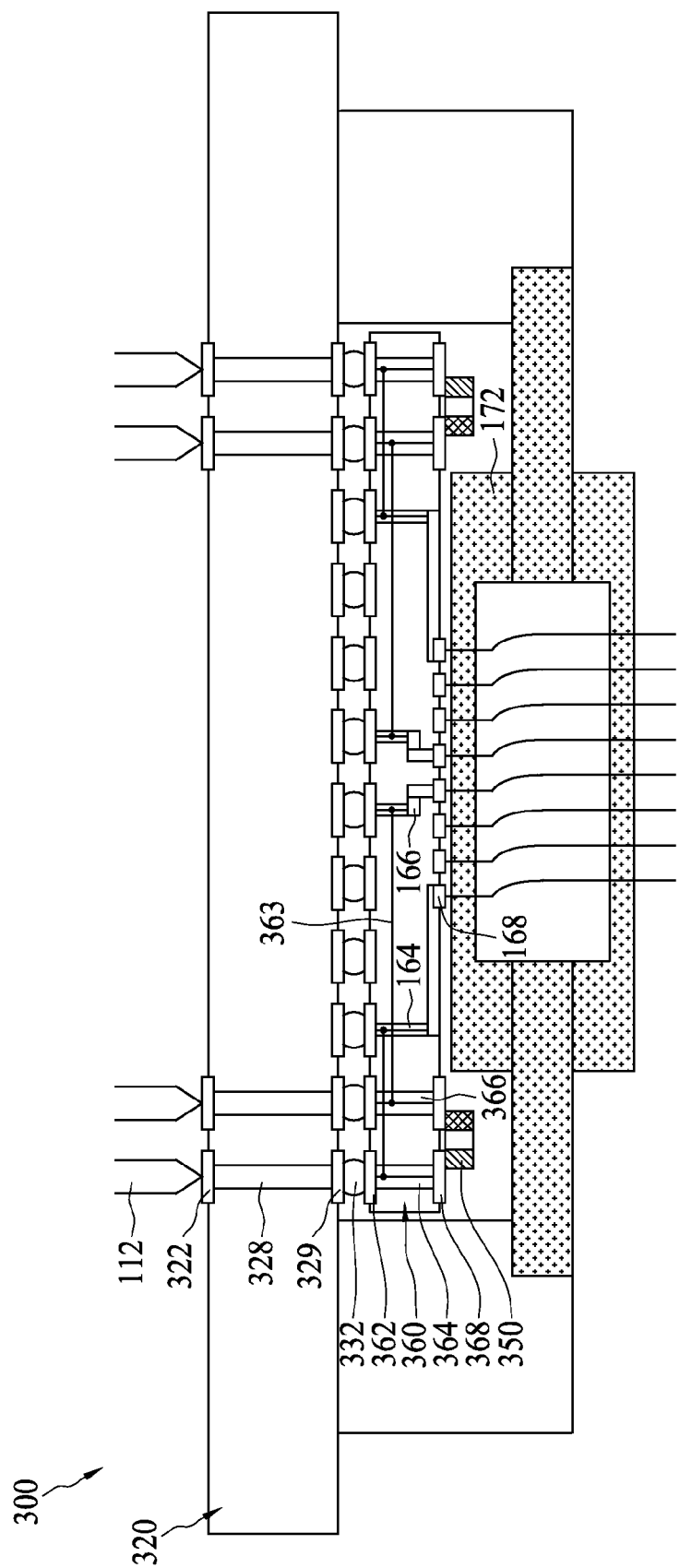
FIG. 5 is a schematic cross-sectional diagram of a probe card with capacitive devices configured on a lower surface of a substrate for comparison purpose.

FIG. 5 is a schematic cross-sectional diagram of a probe card 300 with capacitive devices 350 configured on a lower surface of a substrate 360 for comparison purpose. Compared to the probe card 100 in FIG. 1B, the probe card 300 does not have the interposer layer 140, and the capacitive devices 350 are placed on a periphery of the lower surface of the substrate 360 beyond the upper die 172. Each pogo 112 has a straight-through conductive path from a pad 322 on an upper surface of the PCB 320, through a via hole 328 in the PCB 320, a pad 329 on a lower surface of the PCB 320, a solder bump 332, a pad 362 on an upper surface of the substrate 360, a via hole 364 in the substrate 360 to a pad 368 on the lower surface of the substrate 360 which is coupled to an electrode of the capacitive device 350. The pad 362 on the upper surface of the substrate 360 are coupled to a pad 168 on the lower surface of the substrate 360 through the via hole 364, an interconnect line 363, and an interconnect line 164 or 166. Compared to the probe card 100 in FIG. 1B, the interconnect lines 363 are introduced into the substrate 360. The interconnect lines 164 and 166 in the substrate 360 already causes the substrate 360 to have a high wiring density as the substrate 160. The introduction of the interconnect lines 363 further complicates the already high wiring density of the substrate 360, which can adversely impact the yield of the substrate 360. In addition, the associated circuitry of the capacitive device 350 is formed within the substrate 360. Therefore, when either the conductive paths in the substrate 360 or the circuitry of the capacitive device 350 are not functioning properly, the substrate 360 has to be replaced, as opposed to the interposer layer 140 in FIG. 1B that can be replaced independent of the substrate 360. Furthermore, the area of the periphery of the lower surface of the substrate 360 is limited and therefore can accommodate fewer capacitive devices 350 than the interposer layer 140 in FIG. 1B.

Figure 6:
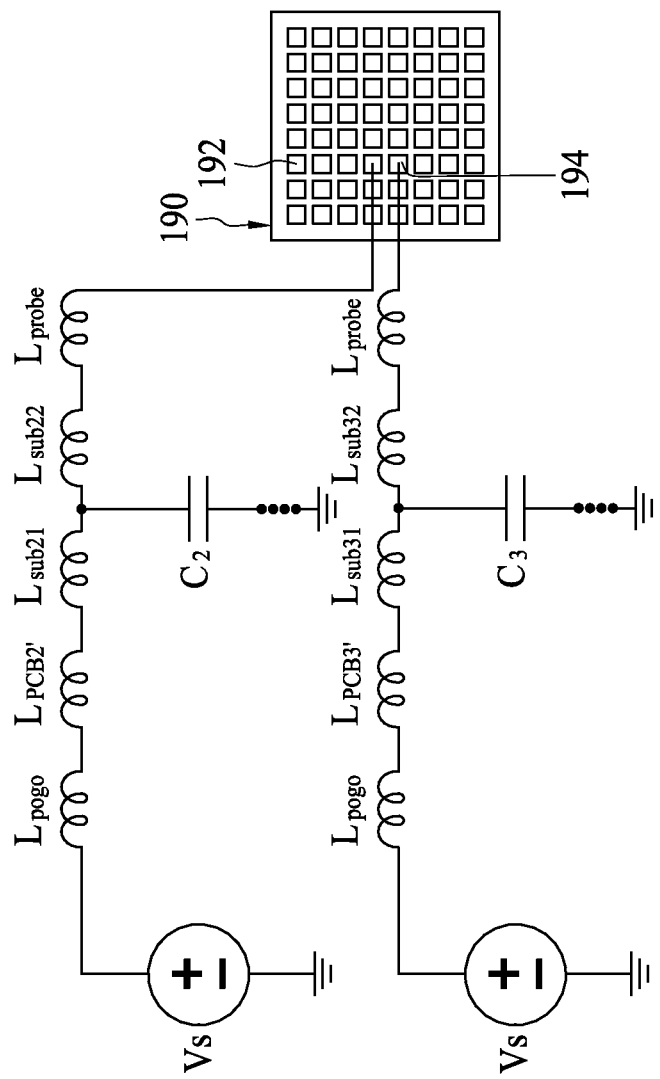
FIG. 6 is a schematic circuit diagram illustrating conductive paths in the probe card in FIG. 5 for comparison purpose.

FIG. 6 is a schematic circuit diagram illustrating conductive paths in the probe card 300 in FIG. 5 for comparison purpose. Compared to one of the conductive paths in FIG. 2, a power conductive path in the PCB 320 includes the pad 322, the via hole 328 and the pad 329, and is represented by an inductor $L_{PCB2'}$ or $L_{PCB3'}$. A power conductive path in the substrate 360 includes a first portion represented by an inductor $L_{sub21}$ or $L_{sub31}$, and a second portion represented by an inductor $L_{sub22}$ or $L_{sub32}$. The first portion includes the pad 362 and the via hole 364. The second portion includes the interconnect line 363, the interconnect line 166 and the pad 168. The capacitive device 350 is coupled between the first portion and the second portion of the power conductive path in the substrate 360. The bypass capacitor $C_2$ or $C_3$ representing the capacitive device 350 is coupled between the inductors $L_{sub21}$ and $L_{sub22}$ or $L_{sub31}$ and $L_{sub32}$. The inductance seen by the power pad 194 in FIG. 6 and the inductance seen by the power pad 194 in FIG. 2 differ by the inductors $L_{PTP2}$ and $L_{sub2}$ in FIG. 2, and the inductor $L_{sub22}$ in FIG. 4, or by the inductors $L_{ITP2}$ and $L_{sub3}$ in FIG. 2, and the inductor $L_{sub32}$ in FIG. 4. Although the inductance seen by the power pad 194 in FIG. 6 is more comparable to the inductance seen by the power pad in FIG. 2, the number of bypass capacitors that can be accommodated by the substrate 360 of the probe card 300 are smaller than the number of capacitors that can be accommodated by the interposer layer 140 of the probe card 100.

Figure 7A:
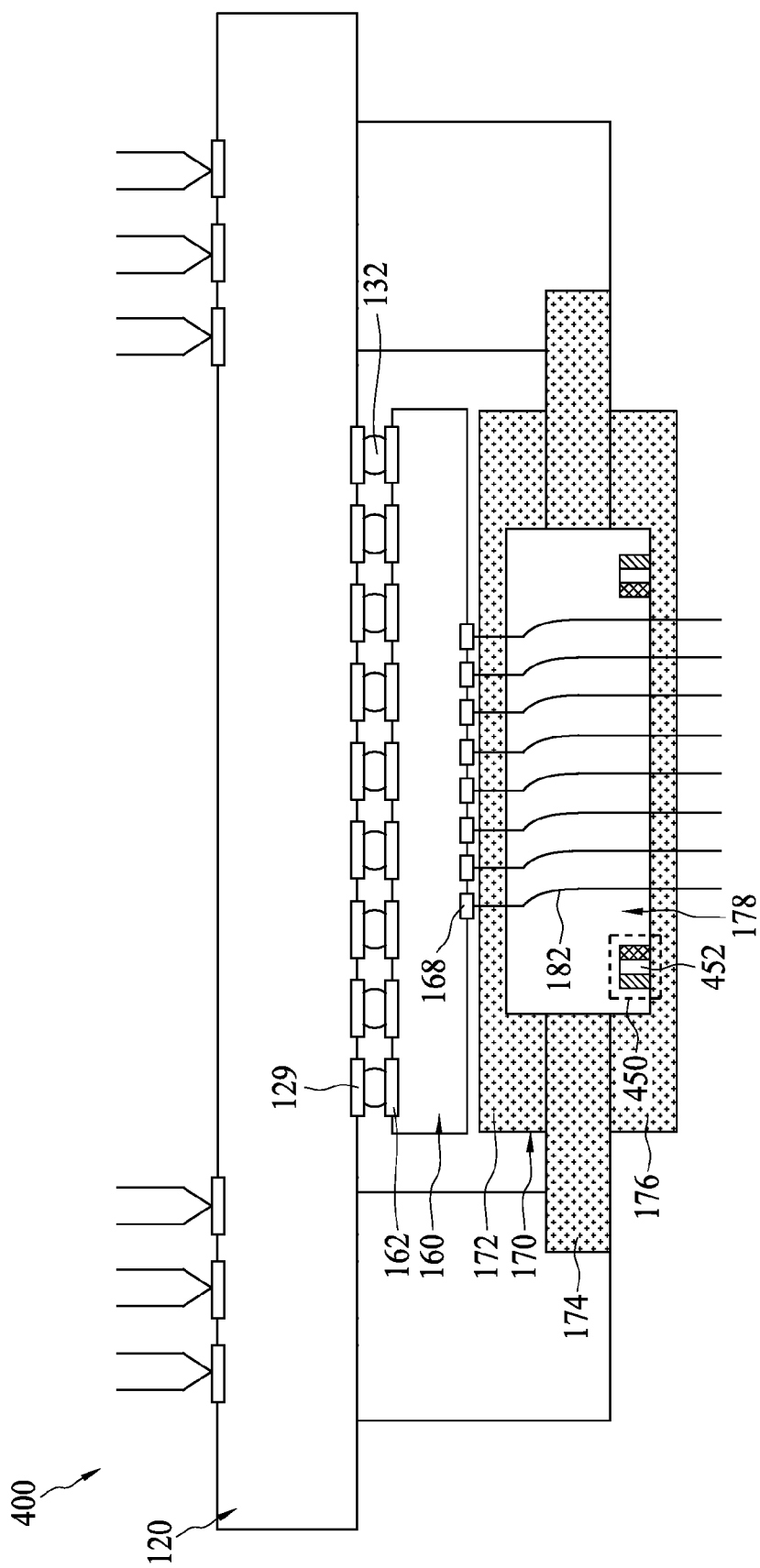
FIG. 7A is a schematic cross-sectional diagram of a probe card with capacitive devices held in the space enclosed by the probe head in accordance with some embodiments.

FIG. 7A is a schematic cross-sectional diagram of a probe card 400 with capacitive devices 452 held in the space 178 enclosed by the probe head 170 in accordance with some embodiments. Compared to the probe card 100 in FIG. 1A, the capacitive devices 452 are placed in the space 178 enclosed by the probe head 170 instead of the interposer layer 140. The pads 129 on the lower surface of the PCB 120 are coupled to the pads 162 on the upper surface of the substrate 160 using the solder bumps 132.

A lower surface of the upper die 172, an inner surface of the spacer 174 and an upper surface of the lower die 176 define a boundary of the space. In some embodiments, the capacitive devices 452 are placed on an upper surface of the lower die 176 of the probe head 170. The capacitive devices 452 are configured surrounding the probes 182 on the upper surface of the lower die 176. Among the surfaces defining the boundary of the space, the upper surface of the lower die 176 is the closest to tips of the probes 182. The tips of the probes are to be in contact with the pads of the DUT. The capacitive devices 452 configured on other surfaces defining the boundary of the space are within the contemplated scope of the present disclosure.

Figure 7B:
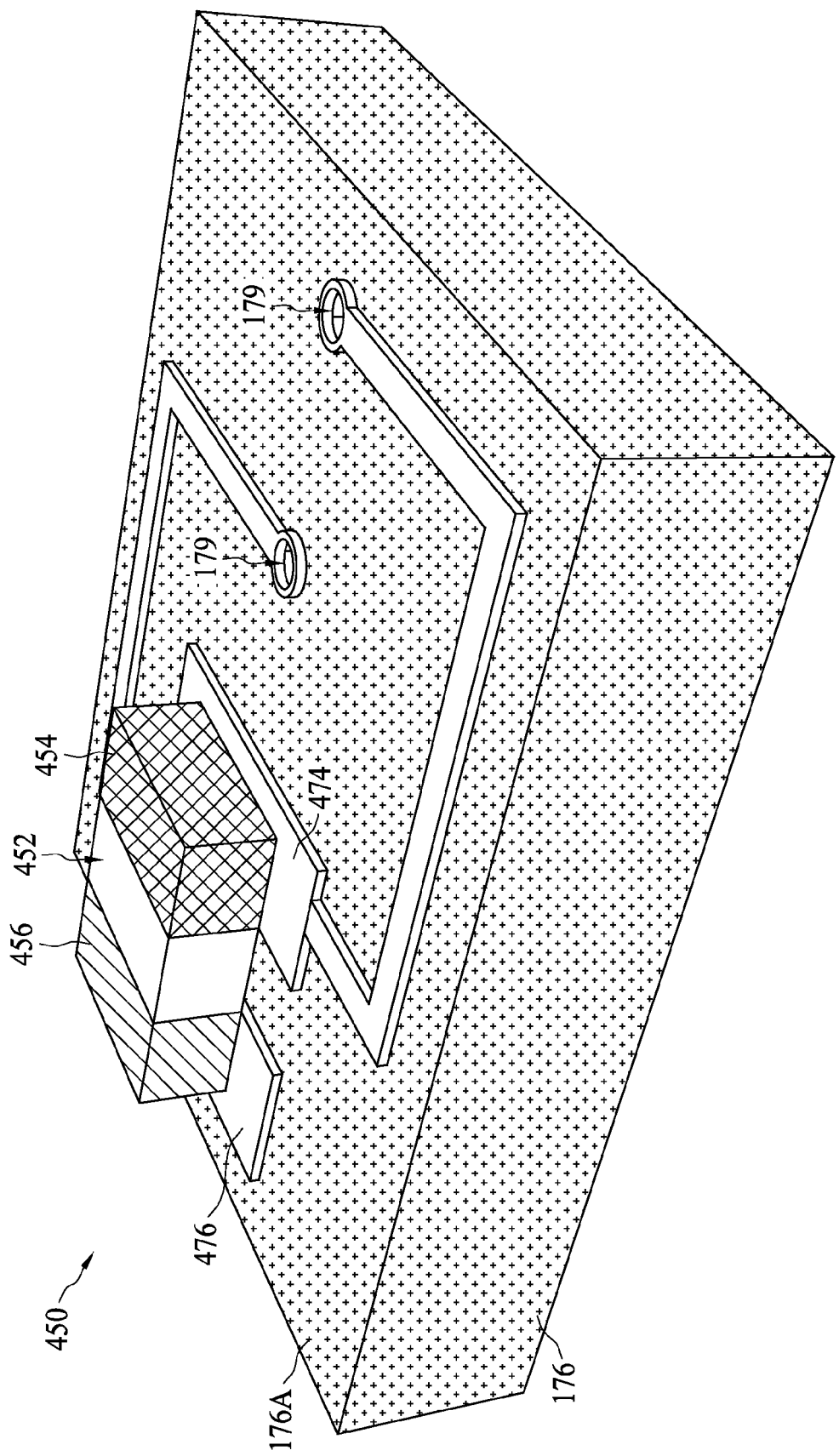
FIG. 7B is a schematic perspective diagram of a zoomed-in portion in FIG. 7A in accordance with some embodiments.

FIG. 7B is a schematic perspective diagram of a zoomed-in portion 450 in FIG. 7A in accordance with some embodiments. The zoomed-in portion 450 illustrates the capacitive device 452 coupled to the probes 182 (shown in FIG. 7A) through sputter plated wires 474 and 476 on the upper surface 176A of the lower die 176. As described with reference to FIG. 1B, the lower die 176 has holes 179 that penetrate through the upper surface 176A and a lower surface (not shown) of the lower die 176. One end of the plated wire 474 or 476 has, for example, a ring shape that conforms to the shape of the hole 179, so as to be coupled to the probe 182. The other end of the plated wire 474 or 476 are placed under and coupled to an anode 454 or a cathode 456 of the capacitive device 452.

Compared to the interconnect lines 363 introduced within the substrate 360 in FIG. 5, the plated wires 474 and 476 on the upper surface 176A of the lower die 176 does not exacerbate the high wiring density of the substrate 160. Furthermore, the associated circuitry of the capacitive device 452 is formed independent of the PCB 120 and the substrate 160. When the circuitry of the capacitive device 452 is not functioning properly, only the lower die 176 has to be replaced.

Figure 8:
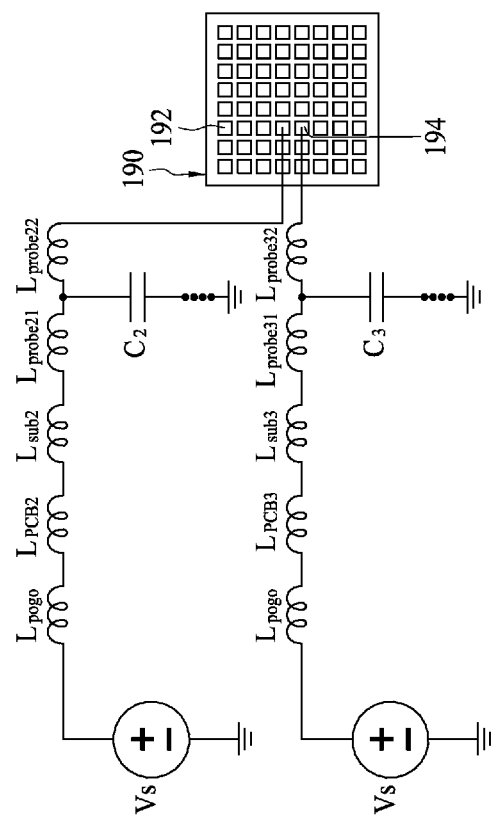
FIG. 8 is a schematic circuit diagram illustrating conductive paths in the probe card in FIGS. 7A and 7B in accordance with some embodiments.

FIG. 8 is a schematic circuit diagram illustrating conductive paths in the probe card 400 in FIGS. 7A and 7B in accordance with some embodiments. Compared to the conductive paths in FIGS. 5 and 6, a power conductive path of the probe 182 includes a first portion represented by an inductor $L_{probe21}$ or $L_{probe31}$ and a second portion represented by an inductor $L_{probe22}$ or $L_{probe32}$. The first portion includes a portion of the probe 182 above the plated wire 174 in FIG. 7B. The second portion includes a portion of the probe 182 below the plated wire 174. The capacitive device is coupled between the first portion and the second portion of the power conductive path of the probe 182. Therefore, a bypass capacitor $C_2$ or $C_3$ representing the capacitive device 452 is coupled between the inductors $L_{probe21}$ and $L_{probe22}$, or $L_{probe31}$ and $L_{probe32}$. The inductors seen by the power pad 194 of the DUT 190 is the inductor $L_{probe22}$ or $L_{probe32}$. The inductance seen by the power pad 194 in FIG. 8 and the inductance seen by the power pad 194 in FIG. 6 differ by the inductor $L_{probe22}$ in FIG. 8, and the inductors $L_{sub22}$ and $L_{probe}$ in FIG. 6, or by the inductor $L_{probe32}$ in FIG. 8, and the inductors $L_{sub32}$ and $L_{probe}$ in FIG. 6. Since the inductance of the inductor $L_{probe22}$ or $L_{probe32}$ is a portion of the inductance of the inductor $L_{probe}$, the inductance seen by the power pad 194 in FIG. 8 is smaller than the inductance seen by the power pad 194 in FIG. 6.

Figure 9:
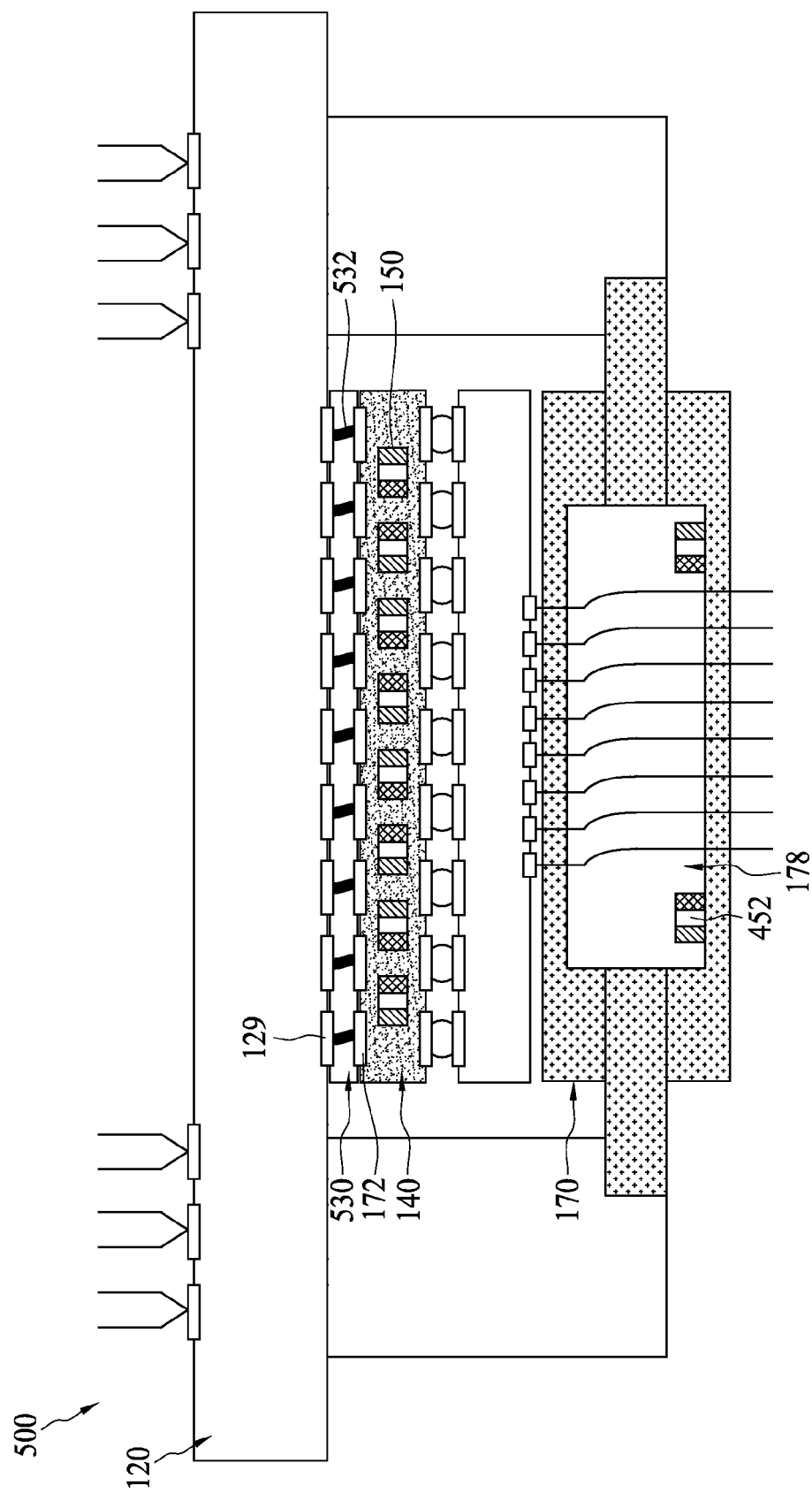
FIG. 9 is a schematic cross-sectional diagram of a probe card with both the capacitive devices embedded in the interposer layer and the capacitive devices held within the space of the probe head in accordance with some embodiments.

FIG. 9 is a schematic cross-sectional diagram of a probe card 500 with both the capacitive devices 150 embedded in the interposer layer 140 and the capacitive devices 452 held within the space 178 of the probe head 170 in accordance with some embodiments. Since the space 178 within the probe head 170 is limited, the capacitive devices 150 embedded in the interposer layer 140 can supplement the number of capacitive devices. In addition, compared to the probe card 100 in FIG. 1A which uses the solder bumps 132 to couple the pads 129 on the lower surface of the PCB 120 to the pads 144 on the upper surface of the interposer layer 140, the probe card 500 in FIG. 9 uses wire bundles 532 to couple the pads 129 to the pads 144. The wire bundles are held within the additional interposer layer 530.

Figure 10:
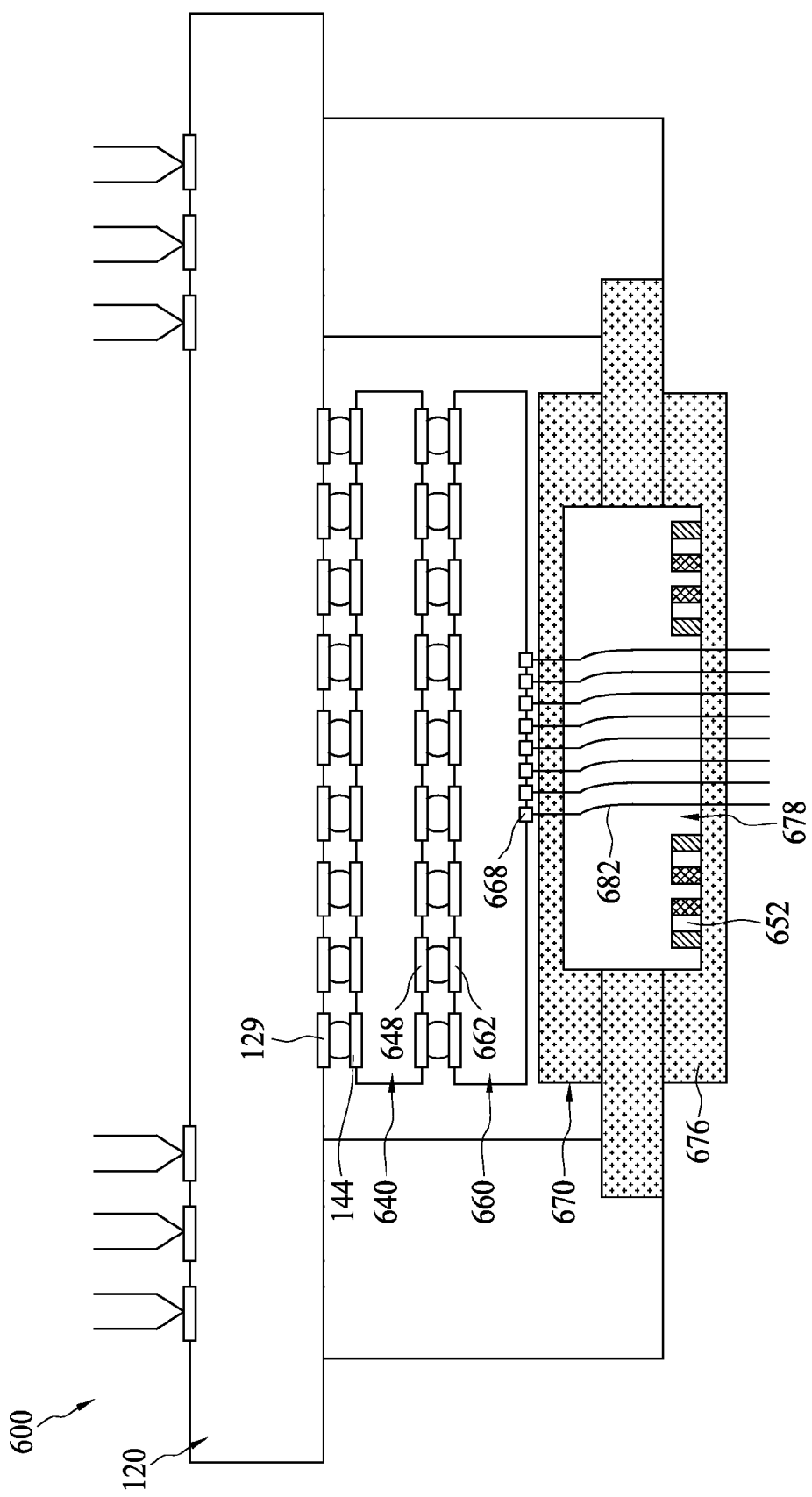
FIG. 10 is a schematic cross-sectional diagram of a probe card with capacitive devices held in a space enclosed by a probe head in accordance with other embodiments.

FIG. 10 is a schematic cross-sectional diagram of a probe card 600 with capacitive devices 652 held in a space 678 enclosed by a probe head 670 in accordance with other embodiments. Compared to the probe card 400 in FIG. 7A, the probe card 600 includes an interposer layer 640 between the PCB 120 and the substrate 660. A pitch of pads 144 on the upper surface of the interposer layer 640 is substantially the same as the pitch of the pads 129 on the lower surface of the PCB 120. The pitch of the pads 144 on the upper surface of the interposer layer 640 is substantially the same as the pitch of the pads 648 on a lower surface of the interposer layer 640. A pitch of pads 662 on an upper surface of the substrate 660 is substantially the same as the pitch of the pads 648 on the lower surface of the interposer layer 640. The pitch of the pads 662 are further reduced to a pitch of pads 668 on a lower surface of the substrate 660. The probes 682 are coupled to the pads 668 with the further reduced pitch. As a result, a pitch of the probes 682 is further reduced compared to that of the probes 182 in FIG. 7A. In this manner, more area on an upper surface of a lower die 676 of the probe head 670 is available for configuring the capacitive devices 652.

In the present disclosure, configurations of probe cards are described with respect to a single DUT for simplicity. However, it is not intended for the probe cards to be limited to testing the single DUT at a time. Without departing from the spirit of the present disclosure, the configurations of the probe cards can be expanded to test multiple DUTs at a time.

Some embodiments have one or a combination of the following features and/or advantages. In some embodiments, the probe card is configured with the capacitive devices embedded in the interposer layer between the PCB and the substrate. The capacitive device serves as a bypass from power to ground at a location between the PCB and the substrate. In some embodiments, the probe card is configured with the capacitive devices held in the space enclosed by the probe head. Compared to the capacitive device configured on the upper surface of the PCB, the capacitive device configured in the interposer layer or in the probe head reduce the inductance of the conductive path of the probe card seen by the pad of the DUT. Compared to the capacitive device configured on the lower surface of the substrate, the capacitive device configured in the probe head reduces the inductance of the conductive path of the probe card seen by the pad of the DUT. Compared to configuring the capacitive devices on the lower surface of the substrate, the interposer layer allows more capacitive devices to be configured therein. Furthermore, the circuitry for the capacitive devices configured in the interposer layer or the probe head is independent of the conductive paths in the PCB or the substrate. Therefore, the interposer layer or the lower die of the probe head can be replaced independent of the PCB or the substrate. In addition, the circuitry for the capacitive devices configured in the interposer layer or the probe head does not further complicate the already high wiring density of the substrate.

In some embodiments, a probe card includes a PCB, a substrate, a pair of probes, a capacitive device and a first part. The PCB includes a pair of conductive paths through a first surface and a second surface of the PCB. The substrate includes a pair of conductive paths through a first surface and a second surface of the substrate. The conductive paths of the substrate and the corresponding conductive paths of the PCB are coupled between the first surface of the substrate and the second surface of the PCB. The probes and the corresponding conductive paths of the substrate are coupled beyond the second surface of the substrate. The capacitive device is coupled between a first conductive path through one of the conductive paths of the PCB, one of the conductive paths of the substrate and one of the probes, and a second conductive path through the other of the conductive paths of the PCB, the other of the conductive paths of the substrate and the other of the probes. The first part is configured beyond the second surface of the PCB and holds the capacitive device.

In some embodiments, a probe card includes a PCB, a substrate, a plurality of probes, an interposer layer and a plurality of first capacitive devices. The PCB includes a plurality of conductive paths through a first surface and a second surface of the PCB. The substrate includes a plurality of conductive paths through a first surface and a second surface of the substrate. The conductive paths of the substrate and the corresponding conductive paths of the PCB are coupled between the first surface of the substrate and the second surface of the PCB. The probes and the corresponding conductive paths of the substrate are coupled beyond the second surface of the substrate. The interposer layer includes a plurality of conductive paths through a first surface and a second surface of the interposer layer. The conductive paths of the interposer layer couple the conductive paths penetrating through the second surface of the PCB to the corresponding conductive paths penetrating through the first surface of the substrate. The first capacitive devices are held by the interposer layer, and coupled between pairs of conductive paths in the interposer layer, respectively.

In some embodiments, a probe card includes a PCB, a substrate, a pair of probes, a probe head and a first capacitive device. The PCB includes a pair of conductive paths through a first surface and a second surface of the PCB. The substrate includes a pair of conductive paths through a first surface and a second surface of the substrate. The conductive paths of the substrate and the corresponding conductive paths of the PCB are coupled between the first surface of the substrate and the second surface of the PCB. The probes and the corresponding conductive paths of the substrate are coupled beyond the second surface of the substrate. The probe head encloses a space. The probes penetrate through the space. The first capacitive device is held in the space, and coupled between the probes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card, comprising:
a printed circuit board (PCB) comprising a plurality of conductive paths through a first surface and a second surface of the PCB;
a substrate comprising a plurality of conductive paths through a first surface and a second surface of the substrate, wherein the plurality of conductive paths of the substrate and the plurality of conductive paths of the PCB corresponding to the plurality of conductive paths of the substrate are coupled between the first surface of the substrate and the second surface of the PCB;
a plurality of probes, wherein the plurality of probes and the plurality of conductive paths of the substrate corresponding to the plurality of probes are coupled beyond the second surface of the substrate;
a probe head disposed under the second surface of the substrate;
wherein
the probe head comprises a plurality of boundary surfaces enclosing a space;
the plurality of probes penetrate through the space and through a plurality of holes in the plurality of boundary surfaces of the probe head;
a pair of plated conductive structures each of which comprises a border conforming to an edge of a corresponding hole of the plurality of holes,
wherein
for each plated conductive structure of the pair of plated conductive structures, the corresponding hole of the plurality of holes is in a first surface of the plurality of boundary surfaces; and
the first surface of the plurality of boundary surfaces is closest to tips of the plurality of probes among the plurality of boundary surfaces; and
a first capacitive device having an anode and a cathode coupled between the pair of plated conductive structures correspondingly coupled to a first conductive path through one of the plurality of conductive paths of the PCB, one of the plurality of conductive paths of the substrate and one of the plurality of probes, and a second conductive path through another of the plurality of conductive paths of the PCB, another of the plurality of conductive paths of the substrate and another of the plurality of probes,
wherein
the anode and the cathode of the first capacitive device define capacitance of the first capacitive device; and
the pair of plated conductive structures correspondingly couple to the first conductive path and the second conductive path through directly coupling to the one of the plurality of probes in the first conductive path and the another of the plurality of probes in the second conductive path.

2. The probe card of claim 1, further comprising:
an interposer layer,
wherein
the first conductive path and the second conductive path penetrate through a first surface and a second surface of the interposer layer facing the second surface of the PCB, and the first surface of the substrate, respectively;
a pitch of the first conductive path and the second conductive path on the first surface of the interposer layer is substantially the same as a pitch of the first conductive path and the second conductive path on the second surface of the interposer layer; and
a pitch of the first conductive path and the second conductive path on the first surface of the substrate is larger than a pitch of the first conductive path and the second conductive path on the second surface of the substrate.

3. The probe card of claim 1, wherein
the first capacitive device is formed on the first surface of the plurality of boundary surfaces.

4. The probe card of claim 1, wherein
the first capacitive device is located in a surrounding of the plurality of probes;
the surrounding of the plurality of probes comprises a first region on the first surface of the plurality of boundary surfaces to corresponding sides of a plurality of first outermost holes of the plurality of holes, a second region on a second surface of the plurality of boundary surfaces to corresponding sides of a plurality of second outermost holes of the plurality of holes, and third surfaces of the plurality of boundary surfaces each of which connected to the first surface of the plurality of boundary surfaces and to the second surface of the plurality of boundary surfaces;
each of the plurality of first outermost holes has a first edge of which at least a first portion does not face any of the plurality of holes other than the first outermost hole;
each of the plurality of second outermost holes has a second edge of which at least a second portion does not face any of the plurality of holes other than the second outermost hole;
each of the plurality of first outermost holes is outermost in a corresponding direction along which the first region is to the corresponding side of the first outermost hole;
each of the plurality of second outermost holes is outermost in a corresponding direction along which the second region is to the corresponding side of the second outermost hole; and
a third region of the plurality of boundary surfaces other than the surrounding of the plurality of probes does not overlap with a dielectric region between the anode and the cathode of the first capacitive device.

5. The probe card of claim 1, wherein
the first capacitive device is formed on any of the plurality of boundary surfaces other than the first surface of the plurality of boundary surfaces.

6. The probe card of claim 1, wherein
the border has a ring shape.

7. The probe card of claim 1, wherein
the probe head comprises:
an upper die;
a lower die further away from the second surface of the substrate than the upper die; and
a spacer in between the upper die and the lower die;

the lower die has an upper surface and a lower surface further away from the second surface of the substrate than the upper surface;
the first surface of the plurality of boundary surfaces is the upper surface of the lower die; and
the corresponding hole of each border penetrates through the upper surface and the lower surface of the lower die.

8. A probe card, comprising:
a printed circuit board (PCB) comprising a plurality of conductive paths through a first surface and a second surface of the PCB;
a substrate comprising a plurality of conductive paths through a first surface and a second surface of the substrate, wherein the plurality of conductive paths of the substrate and the plurality of conductive paths of the PCB corresponding to the plurality of conductive paths of the substrate are coupled between the first surface of the substrate and the second surface of the PCB;
a plurality of probes, wherein the plurality of probes and the plurality of conductive paths of the substrate corresponding to the plurality of probes are coupled beyond the second surface of the substrate;
a probe head disposed under the second surface of the substrate;
wherein
the probe head comprises a plurality of boundary surfaces enclosing a space;
the plurality of probes penetrate through the space and through a plurality of holes in the plurality of boundary surfaces of the probe head;
a pair of plated conductive structures each of which comprises a border conforming to an edge of a corresponding hole of the plurality of holes,
wherein
for each plated conductive structure of the pair of plated conductive structures, the corresponding hole is in a first surface of the plurality of boundary surfaces; and
the first surface of the plurality of boundary surfaces is closest to tips of the plurality of probes among the plurality of boundary surfaces; and
a first capacitive device having an anode and a cathode defining a capacitance of the first capacitive device,
wherein the pair of plated conductive structures are directly coupled to the corresponding anode and cathode of the first capacitive device and are configured to be directly coupled to corresponding probes of the plurality of probes.

9. The probe card of claim 8, wherein
the first capacitive device is formed on the first surface of the plurality of boundary surfaces.

10. The probe card of claim 9, wherein
the first capacitive device is located in a surrounding of the plurality of probes;
the surrounding of the plurality of probes comprises a first region on the first surface of the plurality of boundary surfaces to corresponding sides of a plurality of first outermost holes of the plurality of holes, a second region on a second surface of the plurality of boundary surfaces to corresponding sides of a plurality of second outermost holes of the plurality of holes, and third surfaces of the plurality of boundary surfaces each of which connected to the first surface of the plurality of boundary surfaces and to the second surface of the plurality of boundary surfaces;
each of the plurality of first outermost holes has a first edge of which at least a first portion does not face any of the plurality of holes other than the first outermost hole;
each of the plurality of second outermost holes has a second edge of which at least a second portion does not face any of the plurality of holes other than the second outermost hole;
each of the plurality of first outermost holes is outermost in a corresponding direction along which the first region is to the corresponding side of the first outermost hole;
each of the plurality of second outermost holes is outermost in a corresponding direction along which the second region is to the corresponding side of the second outermost hole; and
a third region of the plurality of boundary surfaces other than the surrounding of the plurality of probes does not overlap with a dielectric region between the anode and the cathode of the first capacitive device.

11. The probe card of claim 8, wherein
the first capacitive device is formed on any of the plurality of boundary surfaces other than the first surface of the plurality of boundary surfaces.

12. The probe card of claim 8, wherein
the border has a ring shape.

13. The probe card of claim 8, wherein
the probe head comprises:
an upper die;
a lower die further away from the second surface of the substrate than the upper die; and
a spacer in between the upper die and the lower die;
the lower die has an upper surface and a lower surface further away from the second surface of the substrate than the upper surface;
the first surface of the plurality of boundary surfaces is the upper surface of the lower die; and
the corresponding hole of each border penetrates through the upper surface and the lower surface of the lower die.

14. A probe card, comprising:
a printed circuit board (PCB) comprising a plurality of conductive paths through a first surface and a second surface of the PCB;
a substrate comprising a plurality of conductive paths through a first surface and a second surface of the substrate, wherein the plurality of conductive paths of the substrate and the plurality of conductive paths of the PCB corresponding to the plurality of conductive paths of the substrate are coupled between the first surface of the substrate and the second surface of the PCB;
a plurality of probes, wherein the plurality of probes and the plurality of conductive paths of the substrate corresponding to the plurality of probes are coupled beyond the second surface of the substrate;
a probe head disposed under the second surface of the substrate;
wherein
the probe head comprises a plurality of boundary surfaces enclosing a space; and
the plurality of probes penetrate through the space and through a plurality of holes in the plurality of boundary surfaces of the probe head;
a first capacitive device coupled between a first conductive path through one of the plurality of conductive paths of the PCB, one of the plurality of conductive paths of the substrate and one of the plurality of probes, and a second conductive path through another of the plurality of conductive paths of the PCB, another of the plurality of conductive paths of the substrate and another of the plurality of probes;

wherein the first capacitive device is located in a surrounding of the plurality of probes;

the surrounding of the plurality of probes comprises a first region on a first surface of the plurality of boundary surfaces to corresponding sides of a plurality of first outermost holes of the plurality of holes, a second region on a second surface of the plurality of boundary surfaces to corresponding sides of a plurality of second outermost holes of the plurality of holes, and third surfaces of the plurality of boundary surfaces each of which connected to the first surface of the plurality of boundary surfaces and to the second surface of the plurality of boundary surfaces;

each of the plurality of first outermost holes has a first edge of which at least a first portion does not face any of the plurality of holes other than the first outermost hole;

each of the plurality of second outermost holes has a second edge of which at least a second portion does not face any of the plurality of holes other than the second outermost hole;

each of the plurality of first outermost holes is outermost in a corresponding direction along which the first region is to the corresponding side of the first outermost hole;

each of the plurality of second outermost holes is outermost in a corresponding direction along which the second region is to the corresponding side of the second outermost hole; and a third region of the plurality of boundary surfaces other than the surrounding of the plurality of probes does not overlap with a dielectric region between an anode and a cathode of the first capacitive device.

15. The probe card of claim 14, wherein
the anode and the cathode of the first capacitive device define a capacitance of the first capacitive device.

16. The probe card of claim 14, further comprising:
a pair of plated conductive structures each of which comprises a border conforming to an edge of a corresponding hole of the plurality of holes; and
the pair of plated conductive structures are directly coupled to the first capacitive device and are configured to be directly coupled to corresponding probes of the plurality of probes.

17. The probe card of claim 16, wherein
the border has a ring shape.

18. The probe card of claim 14, wherein
the first capacitive device is formed on the first surface of the plurality of boundary surfaces.

19. The probe card of claim 14, wherein
the first capacitive device is formed on any of the plurality of boundary surfaces other than the first surface of the plurality of boundary surfaces.

20. The probe card of claim 14, wherein
the probe head comprises:
an upper die;
a lower die further away from the second surface of the substrate than the upper die; and
a spacer in between the upper die and the lower die;
the lower die has an upper surface and a lower surface further away from the second surface of the substrate than the upper surface;
the first surface of the plurality of boundary surfaces is the upper surface of the lower die; and
the corresponding hole of each border penetrates through the upper surface and the lower surface of the lower die.

* * * * *